United States Patent [19]

Garverick et al.

[11] Patent Number: 5,371,501
[45] Date of Patent: Dec. 6, 1994

[54] ARCHITECTURE FOR ARBITRARY NONLINEAR QUANTIZATION OF MULTI-CHANNEL DATA

[75] Inventors: Steven L. Garverick, University Heights, Ohio; Gerald J. Michon, Waterford, N.Y.

[73] Assignee: General Electric Company, Schenectady, N.Y.

[21] Appl. No.: 992,347

[22] Filed: Dec. 16, 1992

[51] Int. Cl.$^5$ .................... H03M 1/12; H03M 1/34; H03M 1/36; H03M 1/62
[52] U.S. Cl. .................... 341/155; 341/139; 341/158; 341/159
[58] Field of Search .............. 341/155, 138, 139, 200, 341/126, 158, 159

[56] References Cited

U.S. PATENT DOCUMENTS

| | | | |
|---|---|---|---|
| 4,243,974 | 1/1981 | Mack | 341/139 |
| 4,517,550 | 5/1985 | Nakamura et al. | 341/139 |
| 4,807,038 | 2/1989 | Michon | 358/213.31 |
| 5,140,326 | 8/1992 | Bacrania et al. | 341/159 |
| 5,187,481 | 2/1993 | Hiller | 341/139 X |

OTHER PUBLICATIONS

U.S. Patent application "Digital Interface for High Dynamic Range Analog Sensors", Ser. No. 07/939,333 (RD-20,430) by G. J. Michon filed Sep. 2, 1992.

*Primary Examiner*—Sharon D. Logan
*Attorney, Agent, or Firm*—Ann M. Kratz; Marvin Snyder

[57] ABSTRACT

An output circuit for use with an array of analog energy detectors includes a system for digital companding which is capable of providing output signals with an enhanced dynamic range. A digital compressor is provided for converting the output signals of the analog detectors into compressed digital values. Accumulators are provided for holding the output signals of the digital compressor. An expander is provided to expand the digital output signals held in the accumulators to determine the energy patterns impinging on the array of analog detectors.

17 Claims, 3 Drawing Sheets

ARCHITECTURE FOR ARBITRARY NONLINEAR QUANTIZATION OF MULTI-CHANNEL DATA

CROSS-REFERENCE TO RELATED APPLICATIONS

This application is related to the following co-pending application which is commonly assigned and is incorporated herein by reference: G. J. Michon, "Digital Interface Circuit for High Dynamic Range Analog Sensors", U.S. application Ser. No. 07/939,333, filed Sep. 2, 1992.

BACKGROUND OF THE INVENTION

1. Field of the Invention

This invention relates to techniques for improving the dynamic range of analog detectors and, more particularly, to employing a digital interface circuit to improve the dynamic range of an analog energy detector having a random offset which can be hundreds of times greater than the signal produced by a quantum particle.

2. Description of the Related Art

In employing wide dynamic range analog detector arrays for detecting patterns of energy impinging thereon, direct sensing of detector outputs conventionally requires analog multiplex circuitry to sample the individual detectors in the array. This analog multiplex circuitry has limited dynamic range, and often introduces Johnson noise and switching noise. The dynamic range of this analog multiplex circuitry is usually significantly lower than the dynamic range of the detectors being sensed and, consequently, limits system dynamic range. Introduction of amplifiers ahead of the multiplex circuitry improves performance, but the full dynamic range of the detector-amplifier combination is still not available because of multiplexer noise.

One-dimensional and two-dimensional image detector arrays have been developed using photodiode technology, charge injection device technology, and charge coupled device technology. The signals produced by the detectors in these arrays are delivered to one or more output nodes using some type of analog multiplexer, usually comprised of either switches or charge transfer devices. The limit on system performance imposed by the multiplexer is a result of the capacitance load of the multiplexer circuitry, Johnson noise introduced by the sampling function, switching interference, or, in the case of charge transfer, the introduction of charge transfer losses and charge transfer noise.

In accordance with aforementioned co-pending application Ser. No. 07/939,333, the dynamic range of an analog sensor is improved by using a digital interface unit with square root companding to reduce the noise produced by analog multiplexing circuitry. The resulting sensor system, however, is not appropriate for configurations in which the detector has a random offset that can be hundreds of times greater than the signal amplitude produced by a quantum particle (an X-ray photon).

SUMMARY OF THE INVENTION

Accordingly, an object of the invention is to improve the dynamic range of analog detectors, especially those detectors with random offsets which may be hundreds of times greater than the signal amplitudes.

Another object of the invention is to perform analog detection using a simpler system of electronics than is taught in the prior art.

The invention differs from a conventional analog companding (compressing/expanding) scheme in that a digital companding curve is employed, with several advantages. The per-channel circuitry is very simple, i.e., there is no analog compression circuitry and each per-channel portion of the analog-to-digital converters comprises a comparator and latch. The compression and expansion curves are well-matched, depending primarily on the linearity of the digital-to-analog converter, and can be much better than what can be achieved if the compression is done with analog circuitry.

Briefly, in accordance with a preferred embodiment of the invention, an energy detection system includes an array of analog energy detecting means and an output circuit for generating a companded digital signal. The output circuit includes digital compressing means for converting the analog output signals to compressed digital signals; accumulating means for accumulating the output signals of the digital compressing means; and output expansion means for expanding the digital output signals in the accumulating means to obtain an indication of energy patterns impinging on the array of analog detecting means.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings, with like numerals throughout the drawings representing like components throughout the drawings, in which:

DETAILED DESCRIPTION OF A PREFERRED EMBODIMENT OF THE INVENTION

Figure 1:
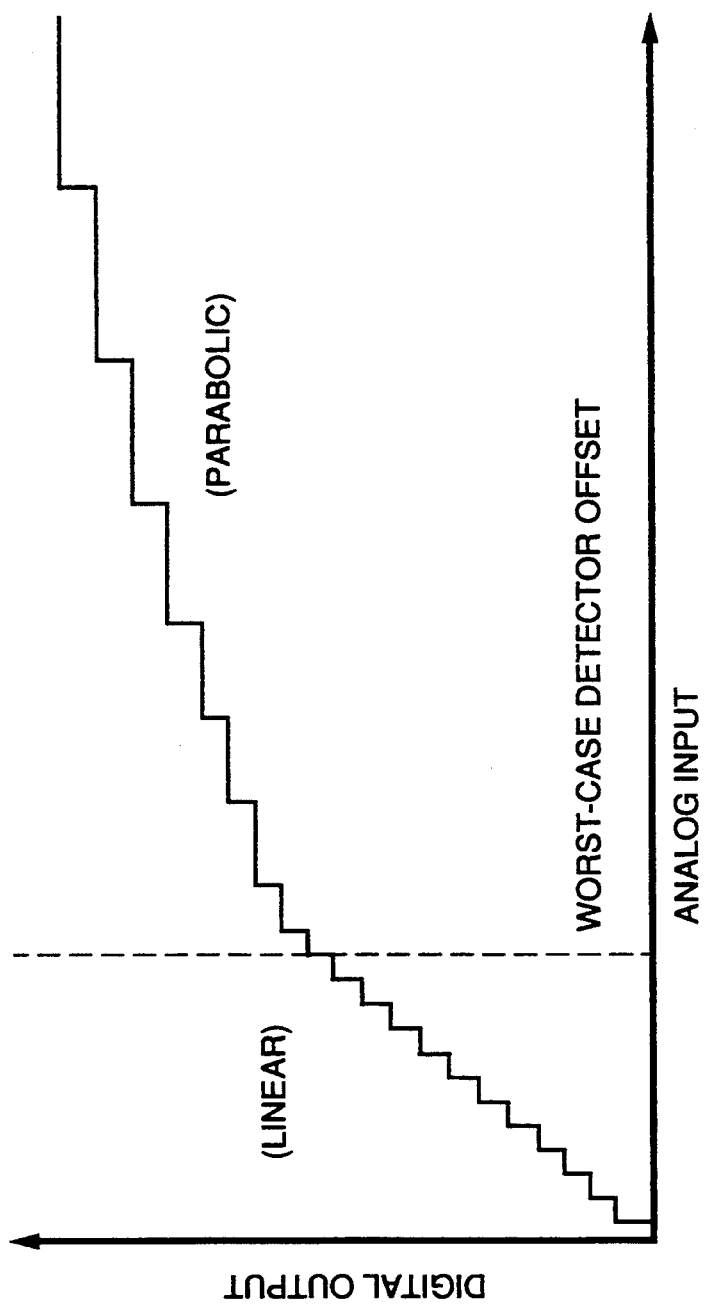
FIG. 1 is a compression curve for shot-noise encoding using a detector with offset.

FIG. 1 is a compression curve for shot-noise (noise proportional to the square root of the signal level) encoding using an energy detector with offset. The compression exploits the quantum nature of the data, i.e., bright pixels (large data) have more noise than dark pixels (small data) and can therefore be quantized more coarsely without loss of image quality. To acquire data with adequate resolution, without prior knowledge of the detector offset, the resolution of the quantizer must be as good as the quantum noise corresponding to the detector output signal minus the worst-case offset. This means that data of less amplitude than the worst-case offset must be quantized linearly using the finest resolution of interest (which in the preferred embodiment is one X-Ray photon), while data of greater amplitude than the worst-case offset can be quantized with resolution proportional to the square root of data amplitude minus the worst-case detector offset.

Figure 2:
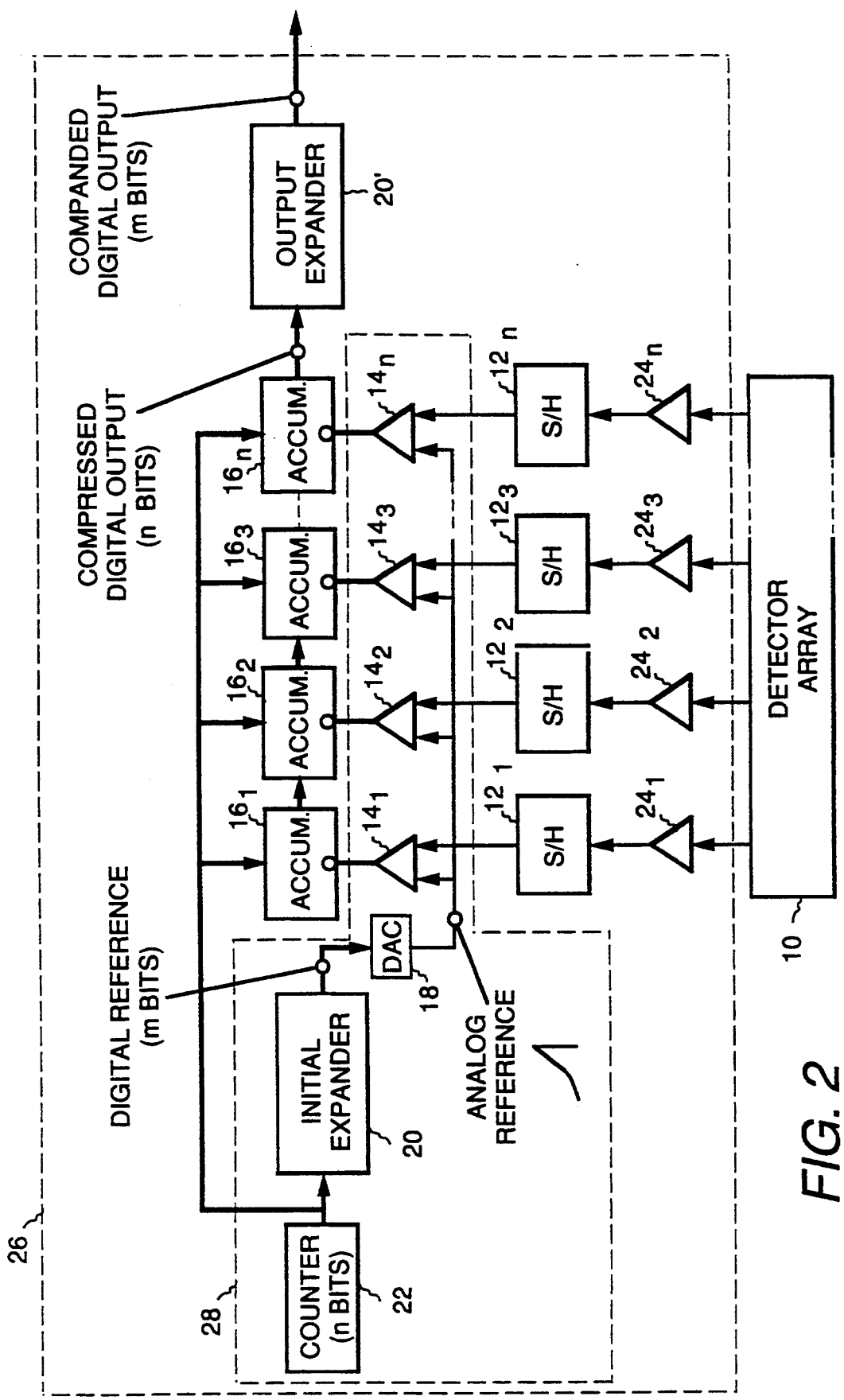
FIG. 2 is a block diagram of system architecture according to a preferred embodiment of the invention.

FIG. 2 is a block diagram of system architecture for an output circuit 26 according to a preferred embodiment of the invention. A detector array 10 generates a plurality of output signals in accordance with the pattern of energy impinging on the array. Detector array 10 can be a linear or area array of diode photon detectors, charge injection device photon detectors, charge coupled device photon detectors, or an array of energy detectors other than photon detectors. Each of the output signals of the array is supplied to output circuit 26. A signal compressor 28, converts the output signal to a compressed digital signal.

To create the compression, initial expander 20 stores an expansion curve (reciprocal of the desired compression curve) in digital memory or in an expansion table. The term "expansion" is used to indicate that the data is being quantized more coarsely. Since the offset is unknown, the preferred method of this coarse quantization, as stated above, is to quantize data with an amplitude value greater than the worst case detector offset with resolution proportional to the square root of data minus the worst case detector offset. Thus, for input signal amplitude values less than or equal to the worst case detector offset, the data should be quantized linearly using the finest resolution, so that the output value of the expansion table equals the input value. When the input signal amplitude value equals or exceeds the maximum random offset value, the expansion table preferably provides a value equal to the maximum random offset value plus the square of the input signal in excess of the maximum offset.

During an acquisition cycle, initial expander 20 is driven by a digital counter 22 to produce a digital version of the expansion curve. This digital reference is applied to a digital-to-analog converter 18 to generate an analog reference which is simultaneously compared by a plurality of comparators $14_1, 14_2, 14_3, \ldots, 14_n$ to the respective detector array output signals. At the same time, the digital counter supplies values directly (i.e., not passing through the expansion table) to respective accumulators $16_1, 16_2, 16_3, \ldots, 16_n$.

Preferably, amplifiers $24_1, 24_2, 24_3, \ldots, 24_n$ amplify the detector array output signals before the output signals are compared to the analog reference signal. In the preferred embodiment, these amplifiers are low-noise, charge-sensitive amplifiers as disclosed in U.S. application Ser. No. 07/939,333. Additionally, it is useful to include a respective one of sampling and holding circuits $12_1, 12_2, 12_3, \ldots, 12_n$ between a respective detector (or, if present, amplifier) and a respective comparator to allow analog-to-digital conversion and readout to proceed on the held data in the output circuit while the next line of data in the array is detected (or amplified).

When the comparator for a given channel trips (i.e., detects that the analog reference signal substantially equals the respective output signal of the detector for that channel), it produces a gating pulse and the respective one of accumulators $16_1$ to $16_n$ coupled thereto latches the counter value. A conversion cycle ends when counter 22 reaches a predetermined value. The data stored in accumulators $16_1$ to $16_n$ at that time thus represent, in compressed form, the digital data provided by detector array 10. At the end of a conversion cycle, the compressed digital data from the channels can be expanded by simply applying the data to expanding means, such as output expander 20'. Preferably output expander 20' is comprised of an expansion table matched to that of initial expander 20.

Preferably, to reduce the number of integrated circuit output pins, accumulators $16_1$ to $16_n$ are parallel-to-serial shift registers which convert the digital data to bit-serial format which is shifted out serially into second expander 20' at the end of a conversion cycle. Examples of commercially available parallel-to-serial shift registers include Motorolla MC14194B (CMOS technology) and Texas Instruments SN54LS674 (bipolar technology). In the configuration of FIG. 2, only one expansion table is needed to expand the data in the accumulators, rather than n tables.

Figure 3:
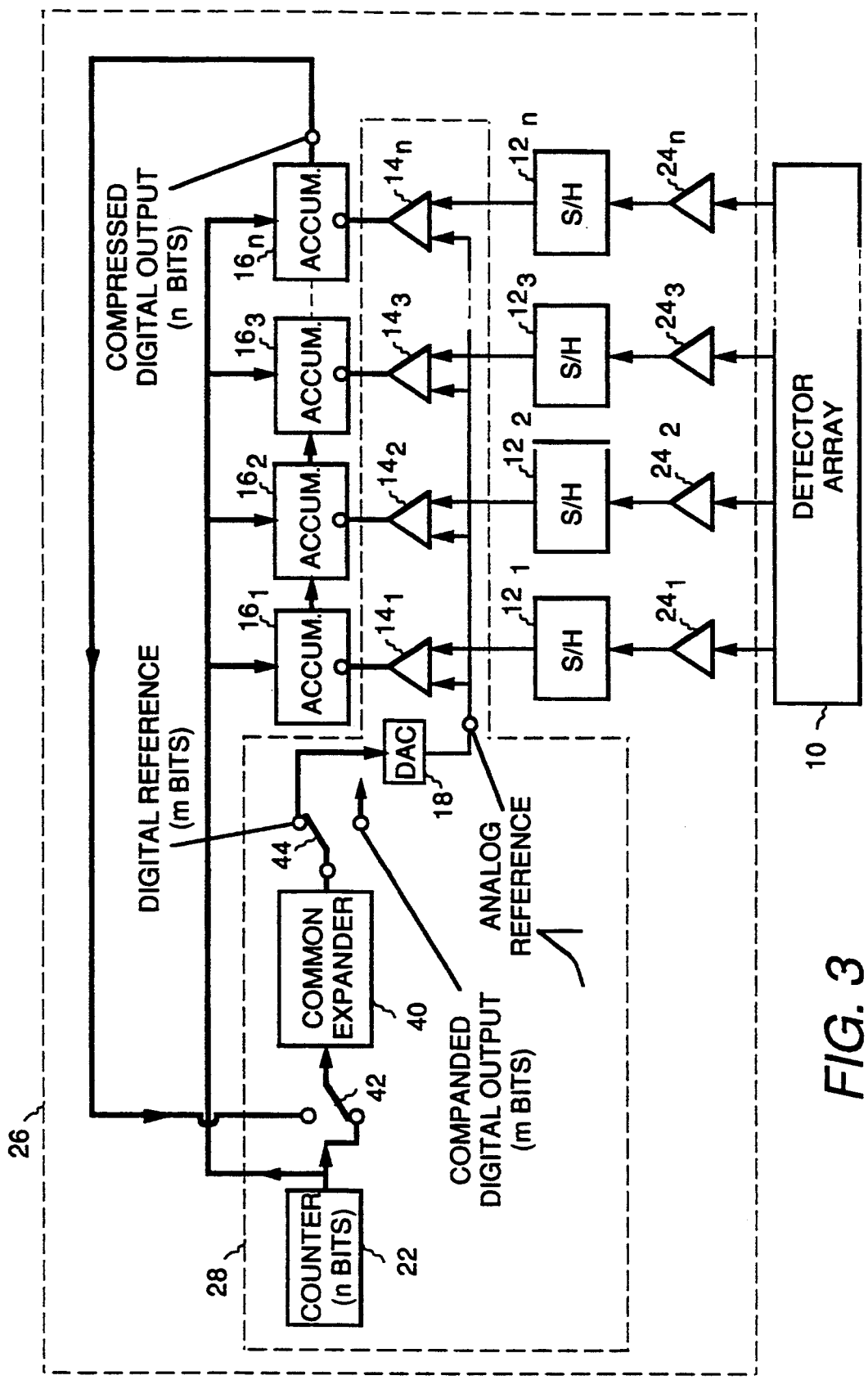
FIG. 3 is a block diagram of system architecture similar to that shown in FIG. 2, except that a common expander is provided for performing the functions of the two expanders shown in FIG. 2.

FIG. 3 is a block diagram showing that an additional way of reducing circuitry is to use a common expander 40 for both initial expander 20 of the counter values and output expander 20' of the compressed data shown in FIG. 2. This is accomplished by using switches 42 and 44. During an initial time period, switch 42 is positioned so the counter value is supplied to common expander 40, and switch 44 is positioned so that the output signal of the common expander is supplied to digital-to-analog converter 18. During a second time period, switch 42 is positioned so that the compressed digital output signal of accumulators $16_1$ to $16_n$ is supplied to common expander 40, and switch 44 is positioned so that the output signal of the common expander (the companded digital output signal) is supplied to the appropriate output terminal (not shown). In this way, only one expansion table is needed for the entire system.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. An energy detection system comprising:
   an array of analog detecting means; and
   an output circuit responsive to said array of analog detecting means for generating a companded digital signal, said output circuit comprising:
   digital compressing means for converting analog output signals of said array of analog detecting means into compressed digital signals;
   accumulating means for accumulating the output signals of said digital compressing means; and
   output expansion means for expanding the output signals in said accumulating means to obtain an indication of energy patterns impinging on said array of analog detecting means.

2. The detection system of claim 1, further including amplifying means coupling said array to said digital compressing means for amplifying the output signals of said array of analog detecting means.

3. The detection system of claim 1, further including sampling and holding means coupling said array to said digital compressing means for sampling and holding the output signals of said array of analog detecting means.

4. The detection system of claim 1, wherein said digital compressing means comprises:
   counter means for generating a digital code;
   initial expansion means for generating a digital reference in response to said digital code;
   digital-to-analog conversion means for converting said digital reference to an analog reference; and
   comparing means for comparing said analog reference to each of the output signals of said array of analog detecting means and for producing a gating pulse whenever said analog reference signal substantially equals the value of an output signal from said array of analog detecting means.

5. The detection system of claim 4, further including amplifying means coupling said array to said digital compressing means for amplifying the output signals of said array of analog detecting means.

6. The detection system of claim 5, further including sampling and holding means coupling said array to said digital compressing means for sampling and holding the analog output signals of said amplifying means.

7. The detection system of claim 5, wherein said amplifying means comprises charge sensitive amplifiers.

8. The detection system of claim 4, wherein said accumulating means comprises:
shift register means for receiving digital codes from said counter means; and
means for latching a digital code from said counter means to said shift register means when said comparing means produces said gating pulse.

9. The detection system of claim 7, wherein said analog detecting means comprises one of the group consisting of diode photon detectors, charge injection device image sensor means, and charge coupled device image sensor means.

10. The detection system of claim 4, wherein said initial expansion means comprises an expansion table for providing a value equal to an input signal value in cases wherein said input signal value is less than or equal to a maximum random offset value and for providing a value equal to said maximum random offset value plus the square of said input signal value in excess of said maximum random offset value in cases wherein said input signal value equals or exceeds said maximum random offset value.

11. The detection system of claim 4, wherein said output expansion means comprises an expansion table for providing a value equal to an input signal value in cases wherein said input signal value is less than or equal to a maximum random offset value and for providing a value equal to said maximum random offset value plus the square of said input signal value in excess of said maximum random offset value in cases wherein said input signal value equals or exceeds said maximum random offset value.

12. The detection system of claim 4, wherein each of said initial expansion means and said output expansion means comprises an expansion table for providing a value equal to an input signal value in cases wherein said input signal value is less than or equal to a maximum random offset value and for providing a value equal to said maximum random offset value plus the square of said input signal value in excess of said maximum random offset value in cases wherein said input signal value equals or exceeds said maximum random offset value.

13. The detection system of claim 8, wherein said shift register means are serially coupled so as to convert the digital data to bit-serial format to be shifted out serially into said output expansion means at the end of a conversion cycle.

14. In an energy detection system including an array of analog detecting means, an output circuit for generating a companded digital signal, comprising:
digital compressing means for converting the output signals of said array into compressed digital signals, said digital compressing means comprising:
counter means for generating a digital code;
initial expansion means for generating a digital reference in response to said digital code;
digital-to-analog conversion means for converting said digital reference to an analog reference; and
comparing means for comparing said analog reference to each of the output signals of said array and for producing a gating pulse whenever said analog reference signal substantially equals the value of an output signal from said array;
accumulating means for accumulating the value of said counter means latched by said comparing means, said accumulating means comprising:
shift register means for receiving digital codes; and
means for latching a digital code from said counter means to said shift register means when said comparing means produces said gating pulse; and
output expansion means for expanding the output signals of said accumulating means to obtain an indication of energy patterns impinging on said array of analog detecting means.

15. The apparatus of claim 14, wherein said initial expansion means and said output expansion means comprise a common expansion table for providing a value equal to an input signal value in cases wherein said input signal value is less than or equal to a maximum random offset value and for providing a value equal to said maximum random offset value plus the square of said input signal value in excess of said maximum random offset value in cases wherein said input signal value equals or exceeds said maximum random offset value.

16. The apparatus of claim 14, wherein said shift register means are serially coupled so as to convert the digital data to bit-serial format to be shifted out serially into said output expansion means at the end of a conversion cycle.

17. The apparatus of claim 14, wherein said output circuit further includes:
amplifying means coupling said array to said digital compressing means for amplifying the output signals of said array; and
sampling and holding means coupling said amplifying means to said digital compressing means for sampling and holding the output signals of said amplifying means.

* * * * *